(12) United States Patent
Xiao et al.

(10) Patent No.: US 10,312,270 B2
(45) Date of Patent: Jun. 4, 2019

(54) ARRAY SUBSTRATE ASSEMBLY AND METHOD OF MANUFACTURING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhilian Xiao, Beijing (CN); Haisheng Zhao, Beijing (CN); Hongxi Xiao, Beijing (CN); Xiaoguang Pei, Beijing (CN); Chong Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/766,140

(22) PCT Filed: Sep. 19, 2017

(86) PCT No.: PCT/CN2017/102280
§ 371 (c)(1),
(2) Date: Apr. 5, 2018

(87) PCT Pub. No.: WO2018/149129
PCT Pub. Date: Aug. 23, 2018

(65) Prior Publication Data
US 2019/0123067 A1 Apr. 25, 2019

(30) Foreign Application Priority Data
Feb. 17, 2017 (CN) .......................... 2017 1 0086972

(51) Int. Cl.
*H01L 27/12* (2006.01)

(52) U.S. Cl.
CPC .......... *H01L 27/127* (2013.01); *H01L 27/124* (2013.01)

(58) Field of Classification Search
CPC .......................... H01L 27/124; H01L 27/127
See application file for complete search history.

(56) References Cited

U.S. PATENT DOCUMENTS 6,569,717 B1    5/2003  Murade
7,288,477 B2 *  10/2007 Choi .................. H01L 27/3244
                                                    438/637

(Continued)

FOREIGN PATENT DOCUMENTS

CN      102403311 A    4/2012
CN      102651340 A    8/2012

(Continued)

OTHER PUBLICATIONS

English Translation of International Search Report & Written Opinion, for PCT Patent Application No. PCT/CN2017/102280, dated Dec. 6, 2017, 19 pages.

(Continued)

*Primary Examiner* — Andrew Q Tran
(74) *Attorney, Agent, or Firm* — Kinney & Lange, P.A.

(57) ABSTRACT

A method of manufacturing an array substrate assembly and an array substrate assembly manufactured by the method are disclosed. The method includes: manufacturing a gate metal layer on a substrate, the gate metal layer including a gate line and a common electrode signal line spaced from each other; forming a gate insulating layer, an active layer, a source-drain electrode layer, a passivation layer, and a protective pattern on the gate metal layer; and forming, in the passivation layer and the gate insulating layer, a via hole configured for a connection to the common electrode signal line. An orthogonal projection of the protective pattern on the substrate and an orthogonal projection of the via hole on the (Continued)

substrate partly coincide with each other, and the orthogonal projection of the protective pattern on the substrate and an orthogonal projection of the gate line on the substrate partly coincide with each other.

16 Claims, 9 Drawing Sheets

(56) References Cited

U.S. PATENT DOCUMENTS

| | | | |
|---|---|---|---|
| 7,977,726 B2* | 7/2011 | Sim | H01L 28/87 |
| | | | 257/296 |
| 9,647,013 B2 | 5/2017 | Liu et al. | |
| 2011/0163310 A1* | 7/2011 | Park | H01L 29/78606 |
| | | | 257/43 |

FOREIGN PATENT DOCUMENTS

| | | |
|---|---|---|
| CN | 203941901 U | 11/2014 |
| CN | 105931987 A | 9/2016 |
| CN | 106094371 A | 11/2016 |
| CN | 106876387 A | 6/2017 |

OTHER PUBLICATIONS

First Chinese Office Action dated Feb. 26, 2019, received for corresponding Chinese Application No. 201710086972.0.

* cited by examiner

ARRAY SUBSTRATE ASSEMBLY AND METHOD OF MANUFACTURING THE SAME

CROSS-REFERENCE TO RELATED APPLICATION

This application is a Section 371 National Stage Application of International Application No. PCT/CN2017/102280, filed on 19 Sep. 2017, entitled "ARRAY SUBSTRATE ASSEMBLY AND METHOD OF MANUFACTURING THE SAME", which has not yet published, which claims priority to Chinese Application No. 201710086972.0, filed on 17 Feb. 2017, incorporated herein by reference in their entirety.

BACKGROUND

1. Technical Field

Embodiments of the present disclosure relate to an array substrate assembly and a method of manufacturing the same.

2. Description of the Related Art

A liquid crystal display panel comprises an array substrate assembly, a color filter substrate assembly, and liquid crystals disposed between the array substrate assembly and the color filter substrate assembly. The array substrate assembly comprises a substrate, and a gate metal layer, a gate insulating layer, an active layer, a source-drain electrode layer, and a passivation layer which are disposed on the substrate.

Generally, the gate metal layer comprises a gate line and a common electrode signal line. After the passivation layer has been manufactured, it is necessary to form a via hole over the common electrode signal line, thereby connecting the common electrode signal line and a common electrode which will subsequently be manufactured on the passivation layer.

In a conventional manufacturing process, in order to increase production efficiency, generally, the passivation layer and the gate insulating layer are cut through in one etching step when forming the via hole. A distance between the gate line and the common electrode signal line is very small while a diameter of the via hole is greater than the distance. For example, generally the distance is only 6 μm while the diameter of the via hole is about 9 μm. As a result, in a manufacturing process, if the via hole is slightly offset from a designed position or has a slightly larger diameter, it is probable that the gate insulating layer over the gate line is completely cut through, so that the gate line is connected with the via hole. In this case, after an indium tin oxide (ITO) film as a common electrode is deposited, both the gate line and the common electrode signal line will be connected with the (ITO) common electrode through the via hole, so that short circuit between the gate line and the common electrode signal line occurs. Thereby, the array substrate assembly shows abnormality.

SUMMARY

Embodiments of the present disclosure provide a method of manufacturing an array substrate assembly, comprising:
providing a substrate;
manufacturing a gate metal layer on the substrate, the gate metal layer comprising a gate line and a common electrode signal line which are spaced from each other;
forming a gate insulating layer, an active layer, a source-drain electrode layer, a passivation layer, and a protective pattern on the gate metal layer; and
forming, in the passivation layer and the gate insulating layer, a via hole configured for a connection to the common electrode signal line;
wherein an orthogonal projection of the protective pattern on the substrate and an orthogonal projection of the via hole on the substrate partly coincide with each other, and the orthogonal projection of the protective pattern on the substrate and an orthogonal projection of the gate line on the substrate partly coincide with each other.

According to embodiments of the present disclosure, the protective pattern is disposed in a same layer as the active layer or as the source-drain electrode layer, or the protective pattern is disposed on the passivation layer or on the gate metal layer.

According to embodiments of the present disclosure, the protective pattern is disposed in a same layer as the active layer, and forming the gate insulating layer, the active layer, the source-drain electrode layer, the passivation layer, and the protective pattern on the gate metal layer comprises:
forming the gate insulating layer on the gate metal layer;
forming a material for the active layer on the gate insulating layer;
etching the material for the active layer so as to form the active layer and the protective pattern; and
forming the source-drain electrode layer and the passivation layer in sequence on the active layer and the protective pattern.

According to embodiments of the present disclosure, the protective pattern is disposed in a same layer as the source-drain electrode layer, and forming the gate insulating layer, the active layer, the source-drain electrode layer, the passivation layer, and the protective pattern on the gate metal layer comprises:
forming the gate insulating layer and the active layer on the gate metal layer in sequence;
forming a material for the source-drain electrode layer on the active layer;
etching the material for the source-drain electrode layer so as to form the source-drain electrode layer and the protective pattern; and
forming the passivation layer on the source-drain electrode layer and the protective pattern.

According to embodiments of the present disclosure, the protective pattern is disposed on the passivation layer, and forming the gate insulating layer, the active layer, the source-drain electrode layer, the passivation layer, and the protective pattern on the gate metal layer comprises:
forming the gate insulating layer, the active layer, the source-drain electrode layer, and the passivation layer on the gate metal layer in sequence; and
etching the passivation layer so as to form the protective pattern on the passivation layer.

According to embodiments of the present disclosure, the protective pattern is disposed on the passivation layer, and forming the gate insulating layer, the active layer, the source-drain electrode layer, the passivation layer, and the protective pattern on the gate metal layer comprises:
forming the gate insulating layer, the active layer, the source-drain electrode layer, and the passivation layer on the gate metal layer in sequence;
forming a layer of protective material on the passivation layer; and
removing a part of the protective material so as to form the protective pattern.

According to embodiments of the present disclosure, the protective material is one of metal, amorphous silicon, silicon nitride, resin and photoresist.

According to embodiments of the present disclosure, the protective pattern is disposed on the gate metal layer, and forming the gate insulating layer, the active layer, the source-drain electrode layer, the passivation layer, and the protective pattern on the gate metal layer comprises:

forming the gate insulating layer on the gate metal layer;
etching the gate insulating layer so as to form the protective pattern on the gate insulating layer; and
forming the active layer, the source-drain electrode layer and the passivation layer in sequence on the gate insulating layer with the protective pattern.

According to embodiments of the present disclosure, the protective pattern is disposed on the gate metal layer, and forming the gate insulating layer, the active layer, the source-drain electrode layer, the passivation layer, and the protective pattern on the gate metal layer comprises:

forming a layer of protective material on the gate metal layer;
removing a part of the protective material so as to form the protective pattern; and
forming the gate insulating layer, the active layer, the source-drain electrode layer, and the passivation layer in sequence on the protective pattern and the gate metal layer.

According to embodiments of the present disclosure, the protective material is one of silicon nitride, resin and photoresist.

According to embodiments of the present disclosure, the orthogonal projection of the protective pattern on the substrate has a circular shape or a polygonal shape.

According to embodiments of the present disclosure, the protective pattern has a thickness which is a half of a thickness of the gate insulating layer.

According to embodiments of the present disclosure, the orthogonal projection of the protective pattern on the substrate and the orthogonal projection of the via hole on the substrate partly coincide with each other on one side of the orthogonal projection of the protective pattern which faces away from the gate line in a direction perpendicular to the gate line, and the orthogonal projection of the protective pattern on the substrate and the orthogonal projection of the gate line on the substrate partly coincide with each other on the other side of the orthogonal projection of the protective pattern which faces towards the gate line in the direction perpendicular to the gate line.

According to embodiments of the present disclosure, a center of the orthogonal projection of the protective pattern on the substrate and a center of the orthogonal projection of the via hole on the substrate are aligned with each other in a direction perpendicular to the gate line.

According to embodiments of the present disclosure, a maximal size, in a longitudinal direction of the gate line, of the orthogonal projection of the protective pattern on the substrate is greater than a maximal size, in the longitudinal direction of the gate line, of the orthogonal projection of the via hole on the substrate.

Embodiments of the present disclosure provide an array substrate assembly manufactured by any one of the above methods.

BRIEF DESCRIPTION OF THE DRAWINGS

In order to describe technical solutions in embodiments of the present disclosure more clearly, accompanying drawings required for describing the embodiments will be simply explained as below. Apparently, the accompanying drawings for the following description are only some embodiments of the present disclosure. Those skilled in the art also could derive other accompanying drawings from these accompanying drawings without making a creative work.

DETAILED DESCRIPTION OF THE EMBODIMENTS

In order that the object, technical solutions and advantages of the present disclosure are more apparent, a detailed description of embodiments of the present disclosure will be further made as below in conjunction with the accompanying drawings.

Figure 1:
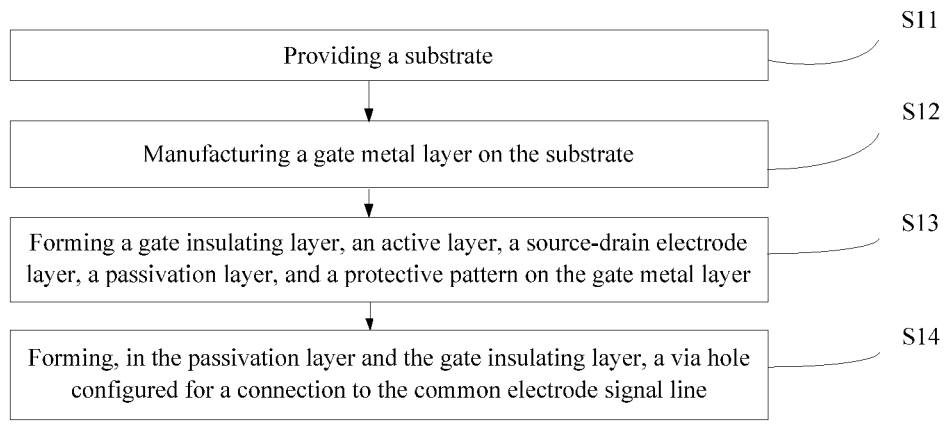
FIG. 1 is a flow diagram of a method of manufacturing an array substrate assembly, according to an embodiment of the present disclosure.

FIG. 1 is a flow diagram of a method of manufacturing an array substrate assembly according to an embodiment of the present disclosure. As shown in FIG. 1, the method comprises the following steps.

In a step S11, a substrate is provided.

In a step S12, a gate metal layer is manufactured on the substrate.

The gate metal layer comprises a gate line and a common electrode signal line which are spaced from each other. The term "spaced" refers to nonintersection between the gate line and the common electrode signal line. For example, the gate line and the common electrode signal line may be spaced from each other to be parallel to each other.

In a step S13, a gate insulating layer, an active layer, a source-drain electrode layer, a passivation layer, and a protective pattern are formed on the gate metal layer.

In a step S14, a via hole configured for a connection to the common electrode signal line is formed in the passivation layer and the gate insulating layer.

An orthogonal projection of the protective pattern on the substrate and an orthogonal projection of the via hole on the substrate partly coincide with each other, and the orthogonal projection of the protective pattern on the substrate and an orthogonal projection of the gate line on the substrate partly coincide with each other.

The protective pattern is formed over the gate line, and the orthogonal projection of the protective pattern on the substrate and the orthogonal projection of the via hole on the substrate partly coincide with each other, and the orthogonal projection of the protective pattern on the substrate and the orthogonal projection of the gate line on the substrate partly coincide with each other. Therefore, in the process of forming the via hole, the gate line is exposed only if the passivation layer, the protective pattern, and the gate insulating layer which are located over the gate line are cut through. However, no protective pattern is disposed over the common electrode signal line. Therefore, in the process of forming the via hole, the common electrode signal line is exposed by cutting through only the passivation layer and the gate insulating layer which are located over the common electrode signal line. Hence, in the process of forming the via hole, it can be ensured that the gate line is not exposed while the common electrode signal line is exposed, thereby avoiding occurrence of short circuit between the gate line and the common electrode signal line.

According to embodiments of the present disclosure, the protective pattern may be disposed in a same layer as the active layer or as the source-drain electrode layer, or the protective pattern may be disposed on the passivation layer or on the gate metal layer.

Figure 2:
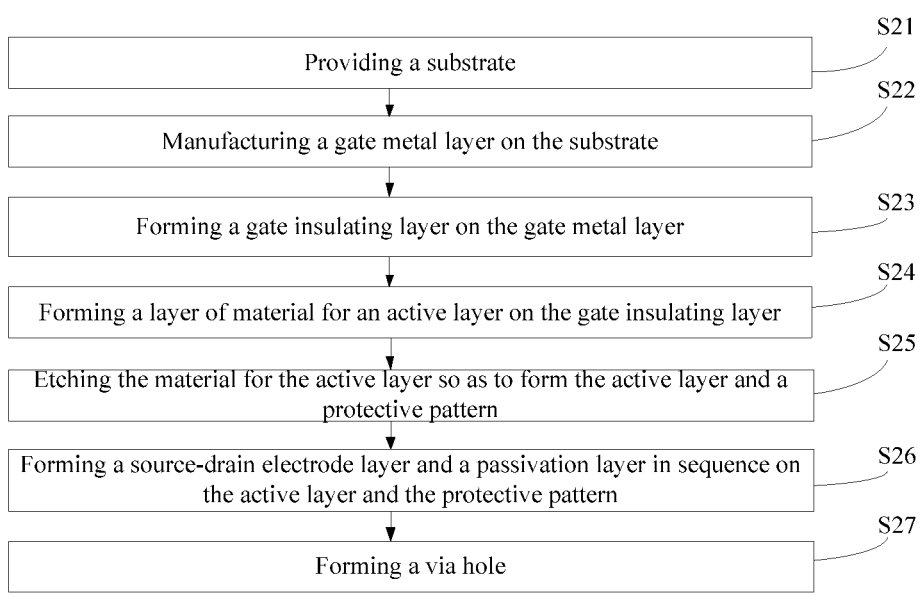
FIG. 2 is a flow diagram of another method of manufacturing an array substrate assembly, according to an embodiment of the present disclosure.
Figure 2A:
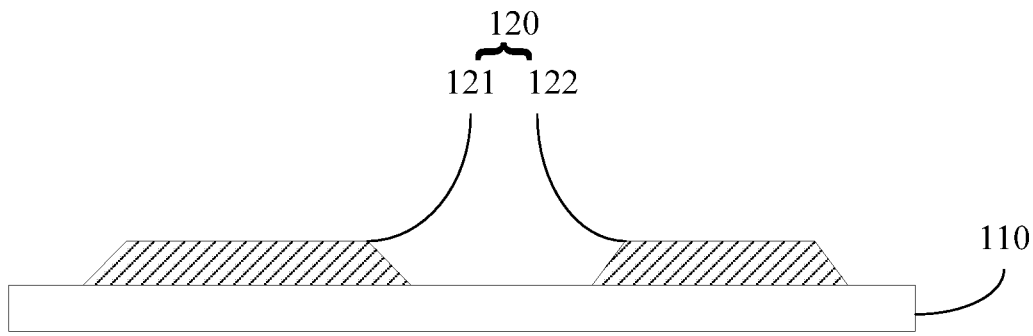
FIG. 2a is a schematic view showing a structure of a substrate formed with a gate metal layer, according to an embodiment of the present disclosure.
Figure 2B:
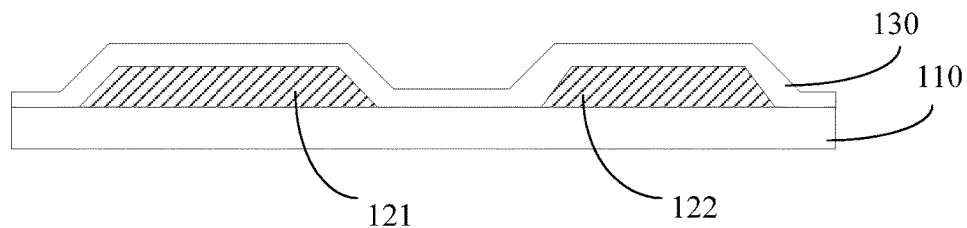
FIG. 2b is a schematic view showing a structure of the substrate formed with a gate insulating layer, according to an embodiment of the present disclosure.
Figure 2C:
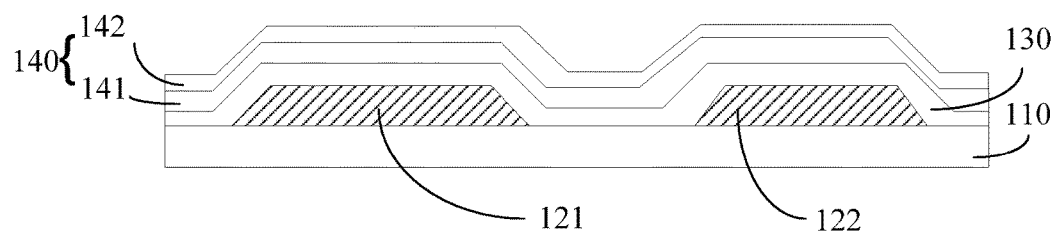
FIG. 2c is a schematic view showing a structure of the substrate formed with a material for an active layer, according to an embodiment of the present disclosure.
Figure 2D:
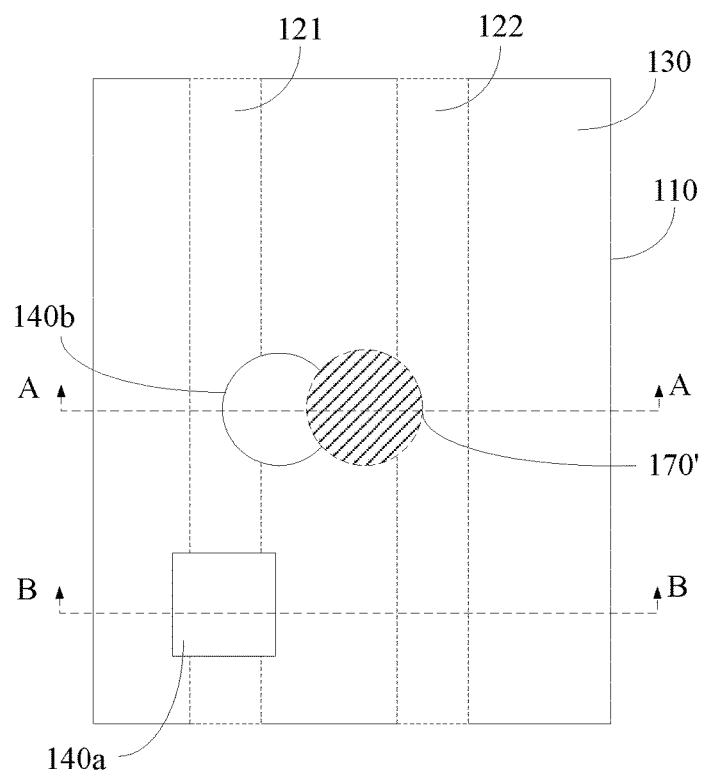
FIG. 2d is a top view of the substrate which has formed with the active layer and a protective pattern, according to an embodiment of the present disclosure.

According to embodiments of the present disclosure, referring to FIG. 2d, the orthogonal projection of the protective pattern 140b on the substrate and the orthogonal projection of the via hole 170' on the substrate partly coincide with each other on one side of the orthogonal projection of the protective pattern which faces away from the gate line 121 in a direction perpendicular to the gate line 121, and the orthogonal projection of the protective pattern 140b on the substrate and the orthogonal projection of the gate line 121 on the substrate partly coincide with each other on the other side of the orthogonal projection of the protective pattern which faces towards the gate line 121 in the direction perpendicular to the gate line 121. A center of the orthogonal projection of the protective pattern 140b on the substrate and a center of the orthogonal projection of the via hole 170' on the substrate may be aligned with each other in the direction perpendicular to the gate line 121. A maximal size, in a longitudinal direction of the gate line 121, of the orthogonal projection of the protective pattern 140b on the substrate may be greater than a maximal size, in the longitudinal direction of the gate line 121, of the orthogonal projection of the via hole 170' on the substrate.

FIG. 2 is a flow diagram of another method of manufacturing an array substrate assembly according to an embodiment of the present disclosure. In the embodiment shown in FIG. 2, a protective pattern is disposed in a same layer as an active layer. As shown in FIG. 2, the method comprises the following steps.

In a step S21, a substrate is provided.

According to embodiments of the present disclosure, the substrate may be a transparent substrate. Specifically, the substrate may be a substrate which is made of a light-transmissible nonmetal material having certain firmness, such as glass, quartz, transparent resin or the like.

Optionally, the provided substrate may be cleaned in advance to ensure cleanness of the substrate.

In a step S22, a gate metal layer is manufactured on the substrate.

As shown in FIG. 2a, the gate metal layer 120 may be manufactured on the substrate 110 by a patterning process. Furthermore, a metal layer may be formed on the substrate 110 by sputtering, and then the gate metal layer 120 is obtained by a patterning process. The metal layer may be aluminum (Al), copper (Cu), molybdenum (Mo), chromium (Cr), titanium (Ti), or the like, or may be formed by laminating a plurality of different metals. The patterning process may be a photolithographic process.

Specifically, the gate metal layer 120 may comprise a gate line 121 and a common electrode signal line 122, the gate line 121 and the common electrode signal line 122 do not intersect each other, and materials of the gate line 121 and the common electrode signal line 122 are the same.

In a step S23, the gate insulating layer is formed on the gate metal layer.

As shown in FIG. 2b, after the gate metal layer 120 has been manufactured, a gate insulating layer 130 is manufactured on the substrate 110 with the gate metal layer 120. Specifically, a layer of material for the gate insulating layer may be deposited on the substrate 110 with the gate metal layer 120, thereby to form the gate insulating layer 130.

Optionally, the gate insulating layer 130 may be an insulating film such as a layer of silicon nitride, silicon oxynitride, or the like.

In a step S24, a material for an active layer is formed on the gate insulating layer.

As shown in FIG. 2c, an amorphous silicon layer 141 and an N-type doped amorphous silicon layer 142 are grown in sequence on the substrate 110 formed with the gate insulating layer 130, thereby to form the material 140 for the active layer.

According to embodiments of the present disclosure, the amorphous silicon layer 141 and the N-type doped amorphous silicon layer 142 may be grown by depositing, and specifically by a plasma-enhanced chemical vapor deposition (PECVD) method.

In a step S25, the material for the active layer is etched so as to form the active layer and the protective pattern.

Figure 2E:
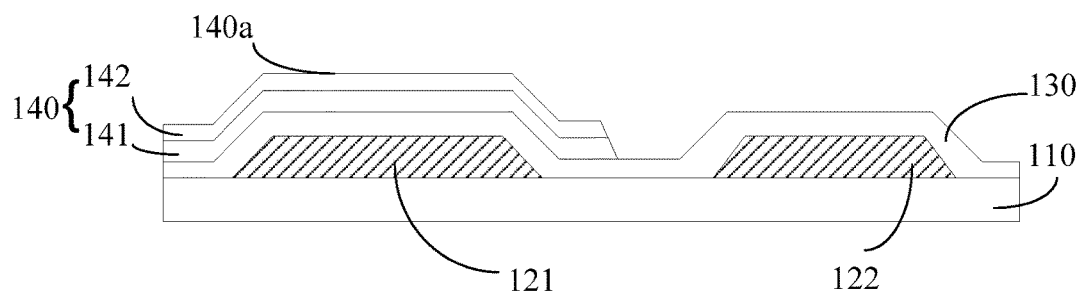
FIG. 2e is a schematic view showing a structure of the substrate formed with the active layer, according to an embodiment of the present disclosure.
Figure 2F:
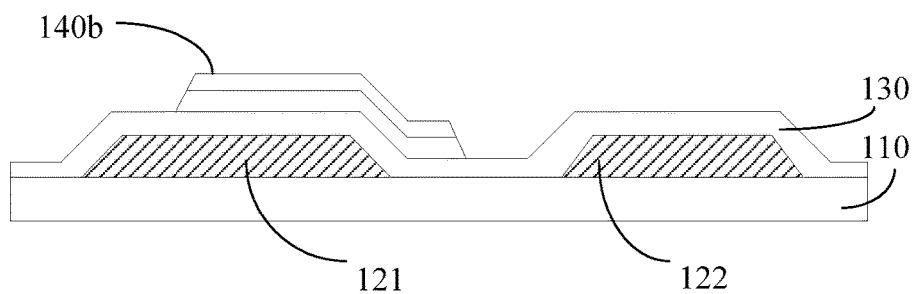
FIG. 2f is a schematic view showing a structure of the substrate formed with the active layer, according to an embodiment of the present disclosure.

FIG. 2d is a top view of the substrate which has formed with the active layer and the protective pattern. A part 170' in FIG. 2d denotes a region where a via hole is to be formed, FIG. 2e and FIG. 2f are sectional views taken along the line B-B and the line A-A in FIG. 2d, respectively, the sectional view taken along the line B-B shows a section where the active layer 140a is located, and the sectional view taken along the line A-A shows a section where the protective pattern 140b is located. The active layer 140a is disposed in the same layer as the protective pattern 140b. As shown in FIG. 2d-FIG. 2f, the active layer 140a and the protective pattern 140b which are independent of each other are formed by a patterning process, the active layer 140a is located in the same layer as the protective pattern 140b, and the active layer 140a is formed of a same material as the protective pattern 140b. The patterning process may be achieved by a photolithographic process, and dry etching may be used as etching technology in the photolithographic process.

In a step S26, a source-drain electrode layer and a passivation layer are formed in sequence on the active layer and the protective pattern.

Specifically, the source-drain electrode layer may be formed on the active layer and the protective pattern in the following manner.

Figure 2G:
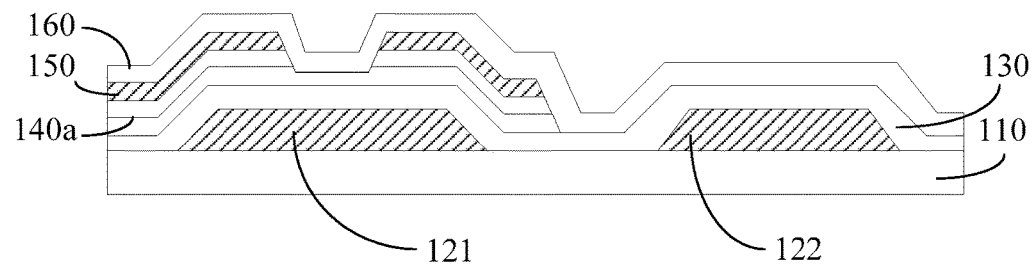
FIG. 2g is a schematic view showing a structure of the substrate formed with a passivation layer, according to an embodiment of the present disclosure.

Firstly, a metal layer is manufactured on the substrate 110 formed with the active layer 140a, and then the source-drain electrode layer 150 is formed in the metal layer by a patterning process, as shown in FIG. 2g. The source-drain electrode layer 150 comprises a source electrode and a drain electrode.

Figure 2H:
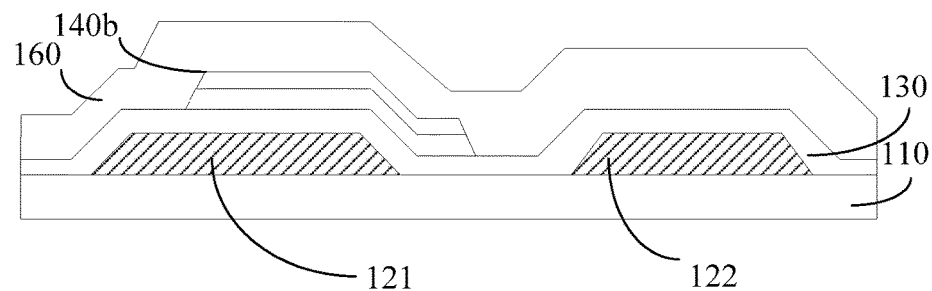
FIG. 2h is a schematic view showing a structure of the substrate formed with the passivation layer, according to an embodiment of the present disclosure.

As shown in FIG. 2g and FIG. 2h (FIG. 2g is a sectional view in a position where the active layer 140a is located, and FIG. 2h is a sectional view in a position where the protective pattern 140b is located), the passivation layer 160 covers the source-drain electrode layer 150 and the protective pattern 140b.

According to embodiments of the present disclosure, in the step S26, the above metal layer may be formed by a sputtering process and specifically by a magnetron sputtering process, while a photolithographic process may be used as the patterning process.

Optionally, the metal layer may be metal such as Al, Cu, Mo, Cr, Ti, or the like, or may be obtained with a design of laminating layers of metals.

Specifically, when the passivation layer 160 is formed, a layer of material for the passivation layer may be deposited on the substrate 110 formed with the source-drain electrode layer 150, thereby to form the passivation layer 160.

Optionally, the layer of material for the passivation layer may be a silicon nitride or silicon oxynitride layer.

In a step S27, a via hole is formed.

Figure 2I:
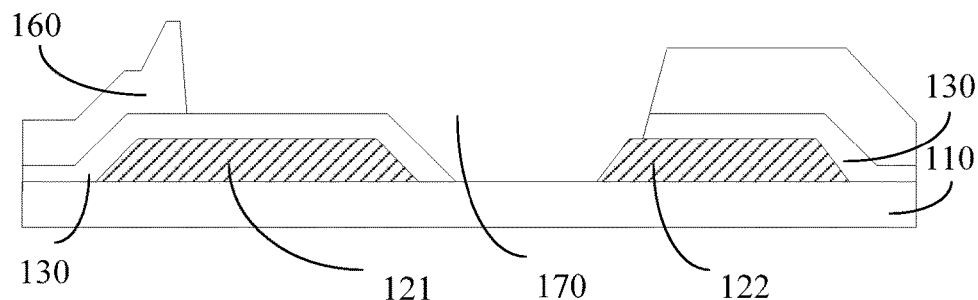
FIG. 2i is a schematic view showing a structure of the substrate formed with a via hole, according to an embodiment of the present disclosure.

As shown in FIG. 2i, a via hole 170 configured for a connection to the common electrode signal line is formed in the passivation layer 160 and the gate insulating layer 130. In conjunction with FIG. 2d, an orthogonal projection of the protective pattern 140b on the substrate 110 and an orthogonal projection of the via hole 170 on the substrate 110 partly coincide with each other, and the orthogonal projection of the protective pattern 140b on the substrate 110 and an orthogonal projection of the gate line 121 on the substrate 110 partly coincide with each other. Thereby, it is ensured that the protective pattern 140b can protect the gate line 121 located under the protective pattern in the process of forming the via hole 170.

Figure 2J:
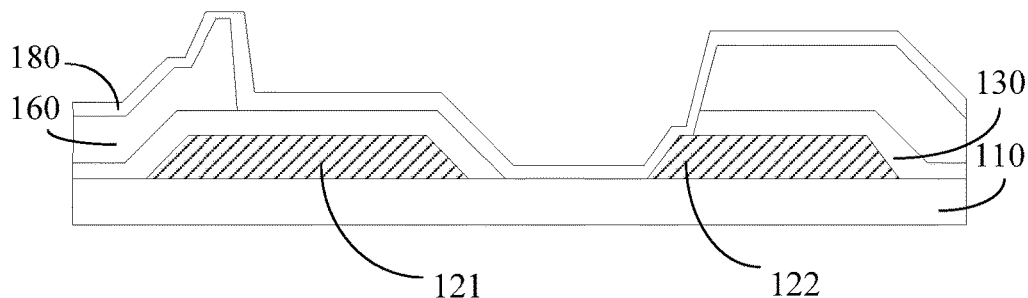
FIG. 2j is a schematic view showing a structure of the substrate formed with an ITO, according to an embodiment of the present disclosure.

As shown in FIG. 2j, after the via hole 170 has been formed, an indium tin oxide (ITO) layer 180 may be deposited on the passivation layer 160 to form a common electrode, so that an array substrate assembly has been manufactured.

When the active layer is manufactured in manufacturing the array substrate assembly in the manufacturing manner shown in FIG. 2, a part of the material for the active layer over the gate line is retained in an etching process so as to form the protective pattern. The protective pattern is disposed in the same layer as the active layer, and the material of the protective pattern is the same as the material of the active layer. Compared with existing technology, with the manufacturing manner shown in FIG. 2, only the pattern in the patterning process in forming the active layer is changed without any additional new step, so that the manufacturing manner is easily achieved.

Figure 3:
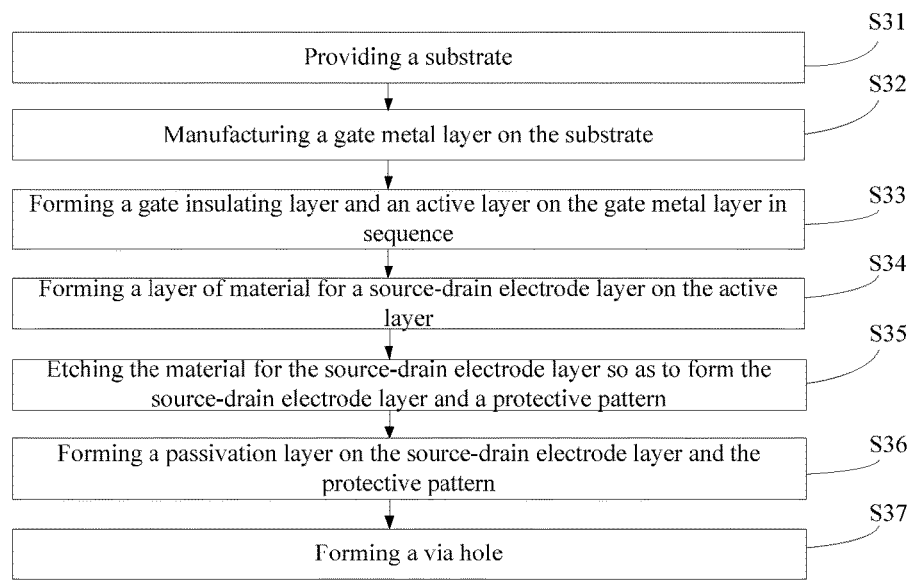
FIG. 3 is a flow diagram of a further method of manufacturing an array substrate assembly, according to an embodiment of the present disclosure.

FIG. 3 is a flow diagram of a further method of manufacturing an array substrate assembly according to an embodiment of the present disclosure. In the embodiment shown in FIG. 3, a protective pattern is disposed in a same layer as a source-drain electrode layer. As shown in FIG. 3, the method comprises the following steps.

In a step S31, a substrate is provided.

Specifically, the above step S21 may be referred to for the step S31 and the step S31 is no longer described in detail herein.

In a step S32, a gate metal layer is manufactured on the substrate.

Specifically, the above step S22 may be referred to for the step S32 and the step S32 is no longer described in detail herein.

In a step S33, the gate insulating layer and the active layer are formed on the gate metal layer in sequence.

The above step S23 may be referred to for a process of forming the gate insulating layer and the process is no longer described in detail herein.

When the active layer is formed, firstly, a material for the active layer may be formed on the gate insulating layer. The above step S24 may be referred to for details. Then, the active layer is formed by a patterning process. The patterning process may be achieved by a photolithographic process, and dry etching technology may be used as etching technology in the photolithographic process.

In a step S34, a material for a source-drain electrode layer is formed on the active layer.

Specifically, a metal layer may be formed on the substrate by sputtering. The metal layer may be metal such as Al, Cu, Mo, Cr, Ti, or the like, or may be obtained by laminating different metals.

In a step S35, the material for the source-drain electrode layer is etched so as to form the source-drain electrode layer and the protective pattern.

Figure 3A:
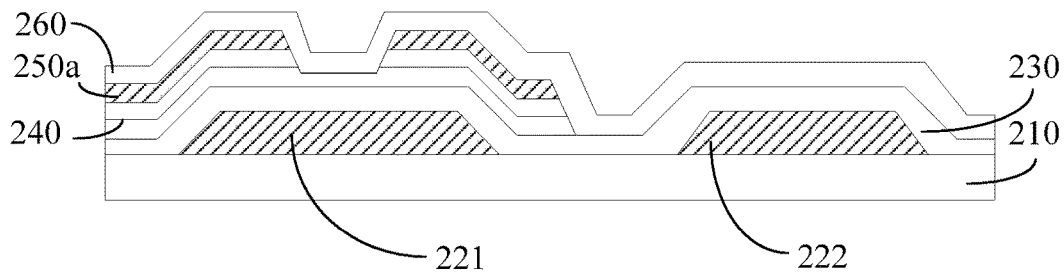
FIG. 3a is a schematic view showing a structure of a substrate formed with a passivation layer, according to an embodiment of the present disclosure.
Figure 3B:
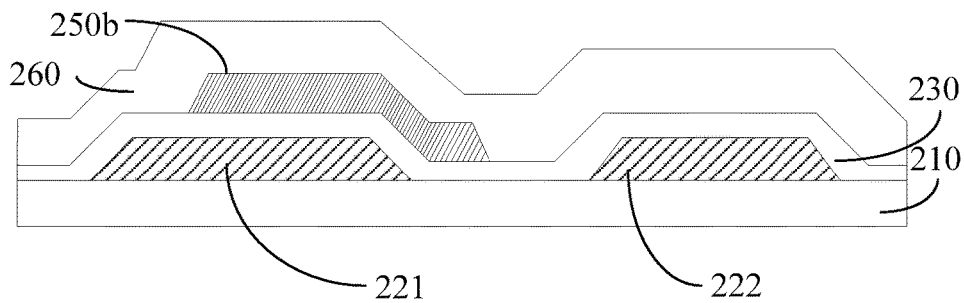
FIG. 3b is a schematic view showing a structure of the substrate formed with the passivation layer, according to an embodiment of the present disclosure.

As shown in FIG. 3a and FIG. 3b (FIG. 3a is a sectional view in a position where the source-drain electrode layer 250a is located, and FIG. 3b is a sectional view in a position where the protective pattern 250b is located), a gate metal layer comprising a gate line 221 and a common electrode signal line 222, a gate insulating layer 230, and an active layer 240 may be formed in sequence on the substrate 210 by a patterning process. A part of material for a source-drain electrode layer is removed by a patterning process so as to form the source-drain electrode layer 250a and a protective pattern 250b which are disposed in the same layer.

In a step S36, a passivation layer is formed on the source-drain electrode layer and the protective pattern.

Specifically, a layer of material for the passivation layer may be deposited on the substrate 210 formed with the source-drain electrode layer 250a, thereby to form the passivation layer 260.

Optionally, the layer of material for the passivation layer may be a layer of silicon nitride or silicon oxynitride.

In a step S37, a via hole is formed.

Specifically, the above step S27 may be referred to for the step S37 and the step S37 is no longer described in detail herein. FIG. 2j may be referred to for structural configuration of the array substrate assembly obtained after the via hole has been formed and finally an ITO has been deposited.

When the source-drain electrode layer is manufactured in manufacturing the array substrate assembly in the manufacturing manner shown in FIG. 3, a part of the material for the source-drain electrode layer over the gate line is retained in an etching process so as to form the protective pattern. The protective pattern is disposed in the same layer as the source-drain electrode layer, and the material of the protective pattern is the same as the material of the source-drain electrode layer. Compared with existing technology, with the manufacturing manner shown in FIG. 3, only the pattern in the patterning process in forming the source-drain electrode layer is changed without any additional new step, so that the manufacturing manner is simply achieved.

Figure 4:
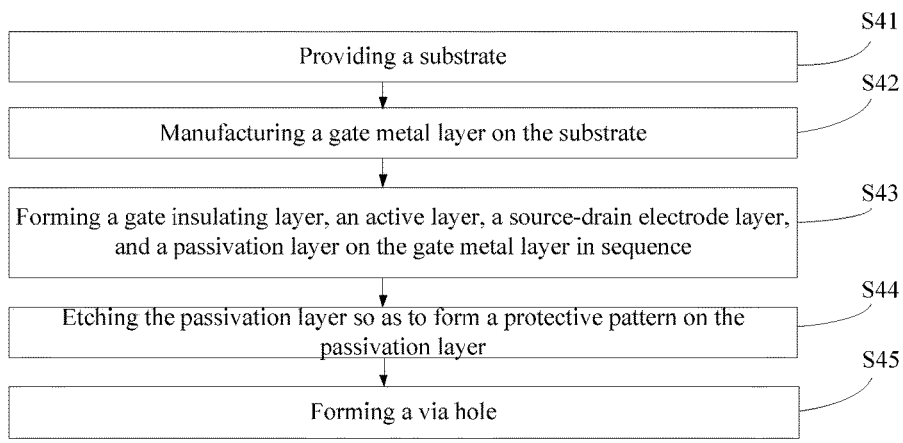
FIG. 4 is a flow diagram of a still another method of manufacturing an array substrate assembly, according to an embodiment of the present disclosure.

FIG. 4 is a flow diagram of a still another method of manufacturing an array substrate assembly according to an embodiment of the present disclosure. In the embodiment shown in FIG. 4, a protective pattern is disposed on a passivation layer, and the protective pattern and the passivation layer are an integrated structure. As shown in FIG. 4, the method comprises the following steps.

In a step S41, a substrate is provided.

Specifically, the above step S21 may be referred to for the step S41 and the step S41 is no longer described in detail herein.

In a step S42, a gate metal layer is manufactured on the substrate.

Specifically, the above step S22 may be referred to for the step S42 and the step S42 is no longer described in detail herein.

In a step S43, a gate insulating layer, an active layer, a source-drain electrode layer, and a passivation layer are formed on the gate metal layer in sequence.

Specifically, the above step S33 may be referred to for processes of forming the gate insulating layer and the active layer, the above step S26 may be referred to for processes of forming the source-drain electrode layer and the passivation layer, and the processes are no longer described in detail herein.

Figure 4A:
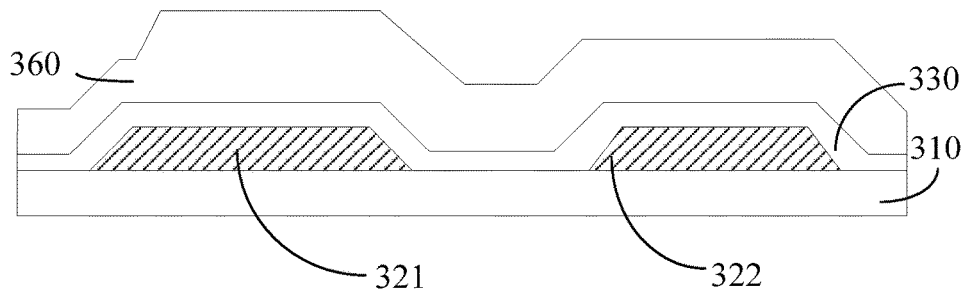
FIG. 4a is a schematic view showing a structure of a substrate formed with a passivation layer, according to an embodiment of the present disclosure.

As shown in FIG. 4a, a gate metal layer comprising a gate line 321 and a common electrode signal line 322, a gate insulating layer 330, and a passivation layer 360 may be formed in sequence on the substrate 310 by a patterning process.

In a step S44, the passivation layer is etched so as to form the protective pattern on the passivation layer.

Figure 4B:
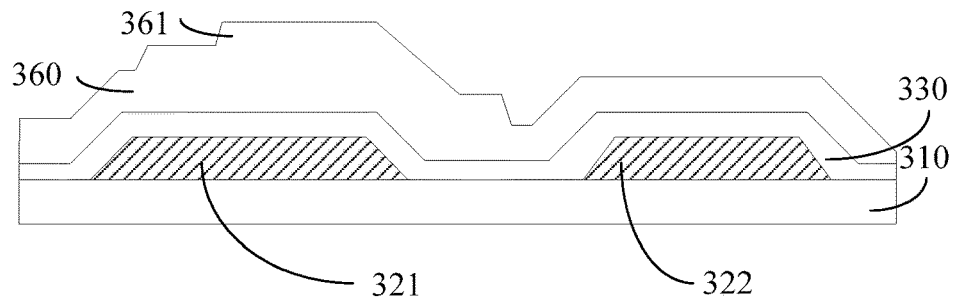
FIG. 4b is a schematic view showing a structure of the substrate formed with a protective pattern, according to an embodiment of the present disclosure.

As shown in FIG. 4b, a part of material for the passivation layer may be removed by a patterning process so as to form the protective pattern 361 on the passivation layer 360.

It is to be noted that in order to ensure that the passivation layer 360 has a sufficient thickness after the protective pattern 361 is formed, a thickness of a material for the passivation layer deposited in the step S43 should be greater than a thickness of a material for the passivation layer deposited when the passivation layer 160 is formed in the step S26.

In a step S45, a via hole is formed.

Specifically, the above step S27 may be referred to for the step S45 and the step S45 is no longer described in detail herein. FIG. 2j may be referred to for structural configuration of the array substrate assembly obtained after the via hole has been formed and finally an ITO has been deposited.

After the passivation layer is manufactured in manufacturing the array substrate assembly in the manufacturing manner shown in FIG. 4, the passivation layer is etched so as to form the protective pattern on the passivation layer. The protective pattern is disposed on the passivation layer, and the protective pattern and the passivation layer are an integrated structure. Compared with existing technology, with the manufacturing manner shown in FIG. 4, only one etching process is added after the passivation layer has been manufactured, so that the manufacturing manner is simple in process and is easily achieved.

Figure 5:
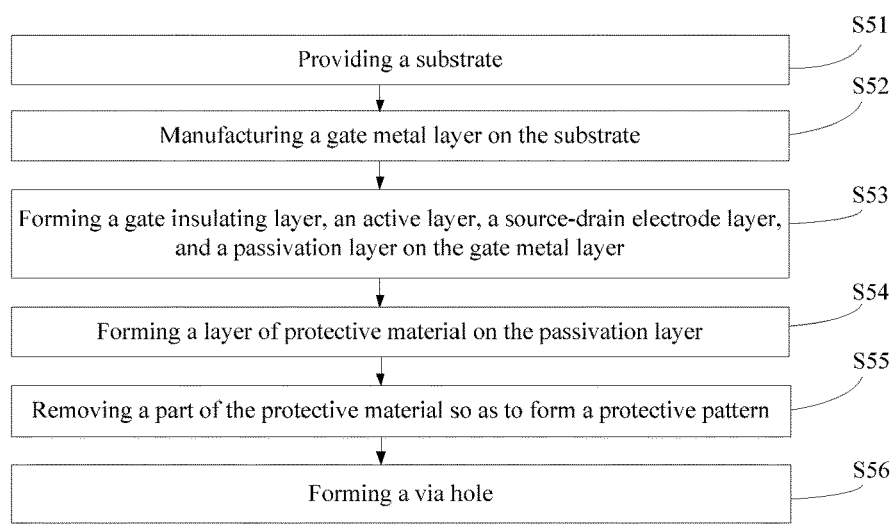
FIG. 5 is a flow diagram of a yet another method of manufacturing an array substrate assembly, according to an embodiment of the present disclosure.

FIG. 5 is a flow diagram of yet another method of manufacturing an array substrate assembly according to an embodiment of the present disclosure. In the embodiment shown in FIG. 5, a protective pattern is disposed on a passivation layer. As shown in FIG. 5, the method comprises the following steps.

In a step S51, a substrate is provided.

Specifically, the above step S21 may be referred to for the step S51 and the step S51 is no longer described in detail herein.

In a step S52, a gate metal layer is manufactured on the substrate.

Specifically, the above step S22 may be referred to for the step S52 and the step S52 is no longer described in detail herein.

In a step S53, a gate insulating layer, an active layer, a source-drain electrode layer, and a passivation layer are formed on the gate metal layer in sequence.

Specifically, the above step S43 may be referred to for the step S53 and the step S53 is no longer described in detail herein.

Figure 5A:
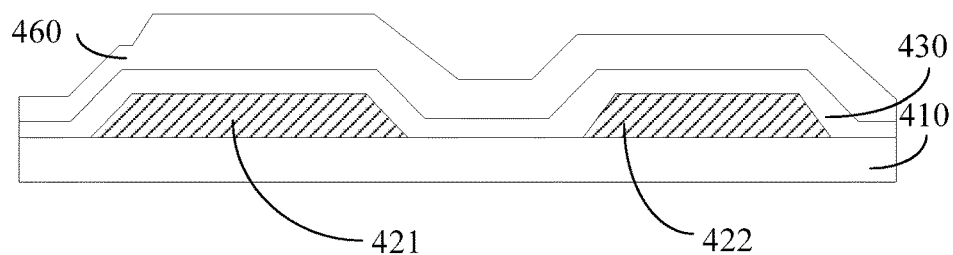
FIG. 5a is a schematic view showing a structure of a substrate formed with a passivation layer, according to an embodiment of the present disclosure.

As shown in FIG. 5a, a gate metal layer comprising a gate line 421 and a common electrode signal line 422, a gate insulating layer 430, and a passivation layer 460 are formed on the substrate 410 in sequence.

In a step S54, a layer of protective material is formed on the passivation layer.

Optionally, the protective material may be one of metal, amorphous silicon, silicon nitride, resin and photoresist. The protective material may be selected according to requirements to be adapted to different technological requirements.

A suitable manner is selected depending upon a different protective material to form a layer of the protective material on the passivation layer. For example, a layer of the protective material may be formed by sputtering when the protective material is a metal material, a layer of the protective material may be formed by PECVD when the protective material is silicon nitride, and a layer of the protective material may be formed by coating when the protective material is photoresist or resin.

In a step S55, a part of the protective material is removed so as to form the protective pattern.

Figure 5B:
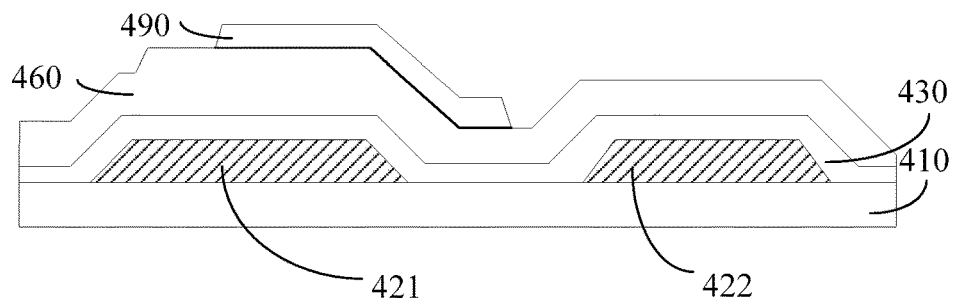
FIG. 5b is a schematic view showing a structure of the substrate formed with a protective pattern, according to an embodiment of the present disclosure.

As shown in FIG. 5b, when the protective material is metal, amorphous silicon or silicon nitride, a part of the protective material may be removed by a patterning process so as to form the protective pattern 490 on the passivation layer 460. When the protective material is photoresist or resin, a part of the protective material may be removed by exposing and developing so as to form the protective pattern 490.

In a step S56, a via hole is formed.

Specifically, the above step S27 may be referred to for the step S56 and the step S56 is no longer described in detail herein. FIG. 2j may be referred to for structural configuration of the array substrate assembly obtained after the via hole has been formed and finally an ITO has been deposited.

After the passivation layer is manufactured in manufacturing the array substrate assembly in the manufacturing manner shown in FIG. 5, one material forming process and one material removing process are added. The protective pattern is formed on the passivation layer by removing a part of the formed protective material. The material of the protective pattern may be the same as or different from the material of the passivation layer. Compared with existing technology, with the manufacturing manner shown in FIG. 5, the steps prior to manufacturing the passivation layer are not changed, thereby facilitating a combination of the new technology with the existing technology.

Figure 6:
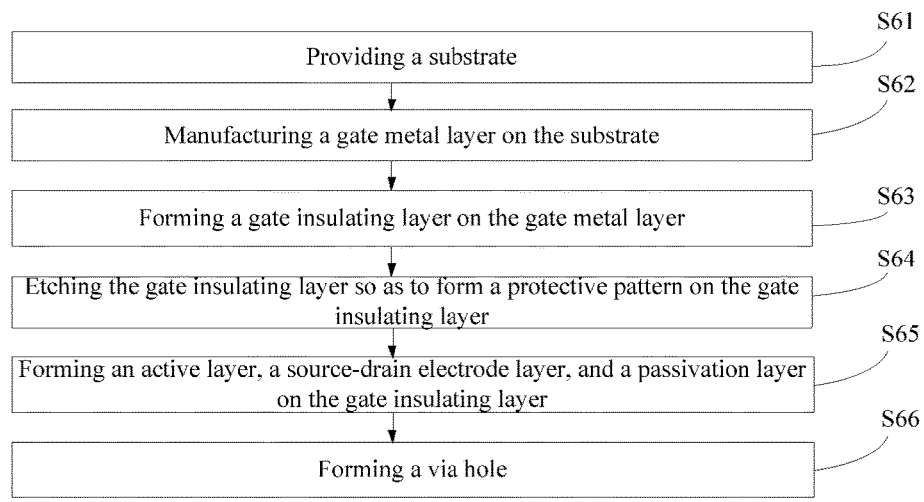
FIG. 6 is a flow diagram of a still further method of manufacturing an array substrate assembly, according to an embodiment of the present disclosure.

FIG. 6 is a flow diagram of a still further method of manufacturing an array substrate assembly according to an embodiment of the present disclosure. In the embodiment shown in FIG. 6, the protective pattern is disposed on the gate insulating layer, and the protective pattern and the gate insulating layer are an integrated structure. As shown in FIG. 6, the method comprises the following steps.

In a step S61, a substrate is provided.

Specifically, the above step S21 may be referred to for the step S61 and the step S61 is no longer described in detail herein.

In a step S62, a gate metal layer is manufactured on the substrate.

Specifically, the above step S22 may be referred to for the step S62 and the step S62 is no longer described in detail herein.

In a step S63, the gate insulating layer is formed on the gate metal layer.

Specifically, the above step S23 may be referred to for the step S63 and the step S63 is no longer described in detail herein.

Figure 6A:
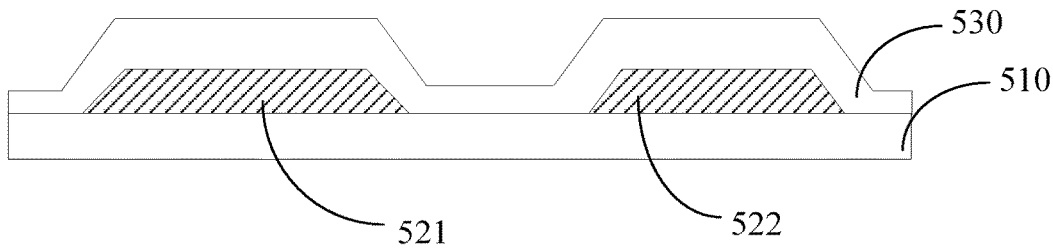
FIG. 6a is a schematic view showing a structure of a substrate formed with a gate insulating layer, according to an embodiment of the present disclosure.

As shown in FIG. 6a, a gate metal layer comprising a gate line 521 and a common electrode signal line 522, and a gate insulating layer 530 may be formed in sequence on the substrate 510 by a patterning process.

In a step S64, the gate insulating layer is etched so as to form the protective pattern on the gate insulating layer.

Figure 6B:
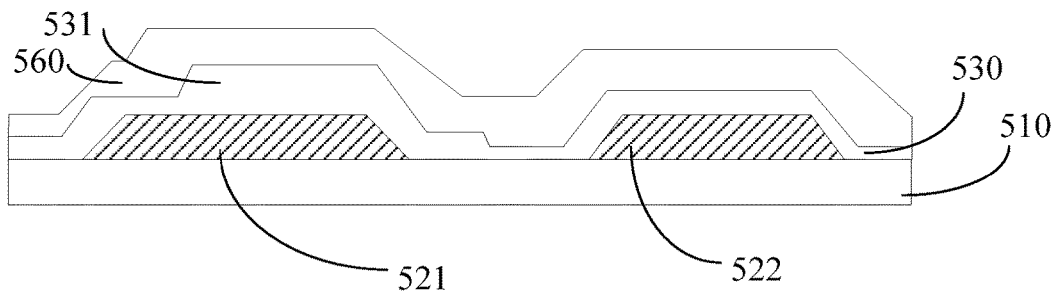
FIG. 6b is a schematic view showing a structure of the substrate formed with a passivation layer, according to an embodiment of the present disclosure.

As shown in FIG. 6b, a part of the gate insulating layer 530 may be removed by a patterning process so as to form the protective pattern 531 on the gate insulating layer 530.

It is to be noted that in order to ensure that the gate insulating layer 530 has a sufficient thickness after the protective pattern 531 is formed, a thickness of the gate insulating layer 530 formed in the step S63 should be greater than a thickness of the gate insulating layer formed in the step S23.

In a step S65, an active layer, a source-drain electrode layer, and a passivation layer are formed on the gate insulating layer in sequence.

Specifically, the formation of the active layer in the above step S33 may be referred to for a process of forming the active layer, the above step S26 may be referred to for processes of forming the source-drain electrode layer and the passivation layer, and the processes are no longer described in detail herein. FIG. 6b may be referred to for a structure obtained after the passivation layer 560 has been formed.

In a step S66, a via hole is formed.

Specifically, the above step S27 may be referred to for the step S66 and the step S66 is no longer described in detail herein. FIG. 2j may be referred to for structural configuration of the array substrate assembly obtained after the via hole has been formed and finally an ITO has been deposited.

When the gate insulating layer is manufactured in manufacturing the array substrate assembly in the manufacturing manner shown in FIG. 6, one etching process is added to etch the material of the gate insulating layer so as to form the protective pattern integrated with the gate insulating layer. The manufacturing manner shown in FIG. 6 is easily achieved with little modification to the existing technology.

Figure 7:
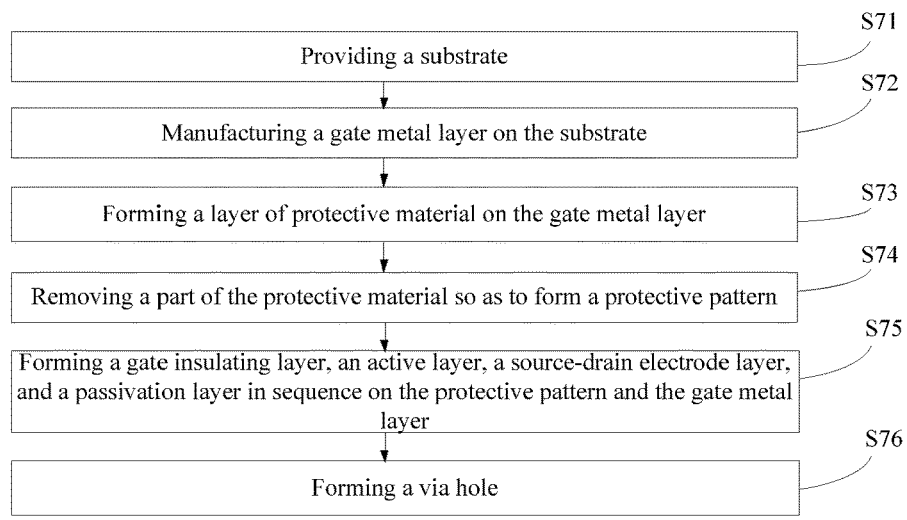
FIG. 7 is a flow diagram of a yet further method of manufacturing an array substrate assembly, according to an embodiment of the present disclosure.

FIG. 7 is a flow diagram of a yet further method of manufacturing an array substrate assembly according to an embodiment of the present disclosure. As shown in FIG. 7, the method comprises the following steps.

In a step S71, a substrate is provided.

Specifically, the above step S21 may be referred to for the step S71 and the step S71 is no longer described in detail herein.

In a step S72, a gate metal layer is manufactured on the substrate.

Specifically, the above step S22 may be referred to for the step S72 and the step S72 is no longer described in detail herein.

Figure 7A:
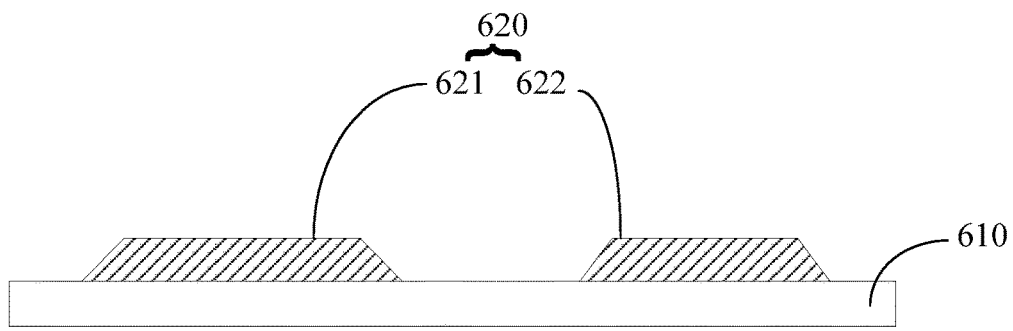
FIG. 7a is a schematic view showing a structure of a substrate formed with a gate metal layer, according to an embodiment of the present disclosure.

As shown in FIG. 7a, a gate metal layer 620 comprising a gate line 621 and a common electrode signal line 622 may be formed on the substrate 610 by a patterning process.

In a step S73, a layer of protective material is formed on the gate metal layer.

Optionally, the protective material may be an insulating material. For example the protective material may be one of silicon nitride, resin and photoresist. The insulating material as the protective material can prevent the gate line from being electrically connected through the protective pattern to the common electrode formed in the sequent step. The protective material may be selected according to requirements to be adapted to different technological requirements.

Figure 7B:
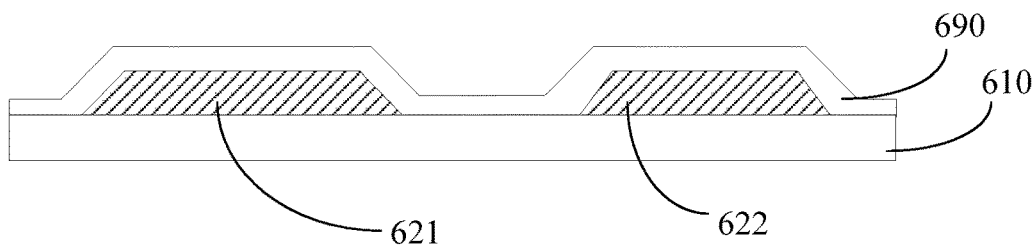
FIG. 7b is a schematic view showing a structure of the substrate formed with a protective material, according to an embodiment of the present disclosure.

As shown in FIG. 7b, a protective material 690 is formed on the substrate 610 formed with the gate metal layer 620. A suitable manner is selected depending upon a different protective material to form a layer of the protective material 690 on the passivation layer. For example, when the protective material 690 is silicon nitride, a layer of the protective material may be formed by PECVD; and when the protective material 690 is photoresist, a layer of the protective material may be formed by applying the photoresist.

In a step S74, a part of the protective material is removed so as to form the protective pattern.

Figure 7C:
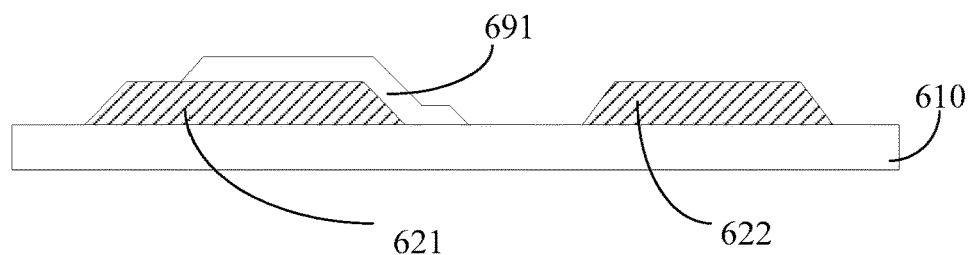
FIG. 7c is a schematic view showing a structure of the substrate formed with a protective pattern, according to an embodiment of the present disclosure.

As shown in FIG. 7c, a part of the protective material 690 is removed so as to form the protective pattern 691. A corresponding process manner is selected depending upon a different protective material 690 to remove a part of the protective material 690. For example, when the protective material is silicon nitride, a part of the protective material 690 may be removed by a patterning process (for example a photolithographic process) so as to form the protective pattern 691 on the gate metal layer 620; and when the protective material 690 is photoresist or resin, a part of the protective material 690 may be removed by exposing and developing so as to form the protective pattern 691.

In a step S75, a gate insulating layer, an active layer, a source-drain electrode layer, and a passivation layer are formed in sequence on the protective pattern and the gate metal layer.

Figure 7D:
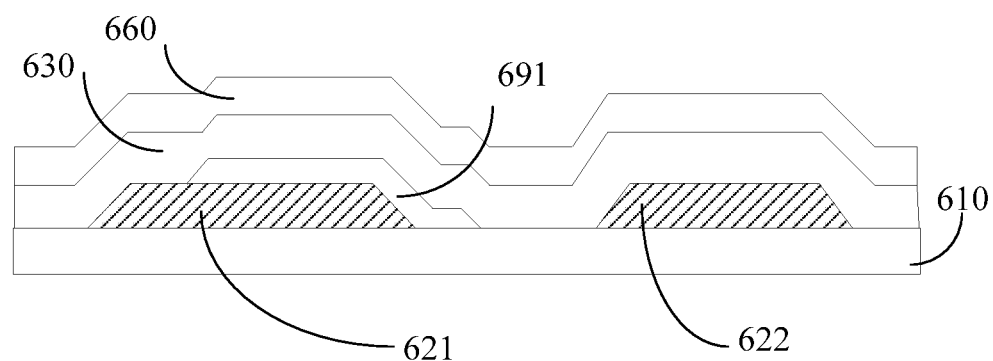
FIG. 7d is a schematic view showing a structure of the substrate formed with a passivation layer, according to an embodiment of the present disclosure.

Specifically, the above step S43 may be referred to for the step S75 and the step S75 is no longer described in detail herein. FIG. 7d may be referred to for a structure obtained after the passivation layer 660 has been formed. Since the protective pattern 691 is formed in the proximity of the gate metal layer, each of the gate insulating layer 630 and the passivation layer 660 formed after the protective pattern 691 will be formed with a protrusion in a position corresponding to the protective pattern 691.

In a step S76, a via hole is formed.

Figure 7E:
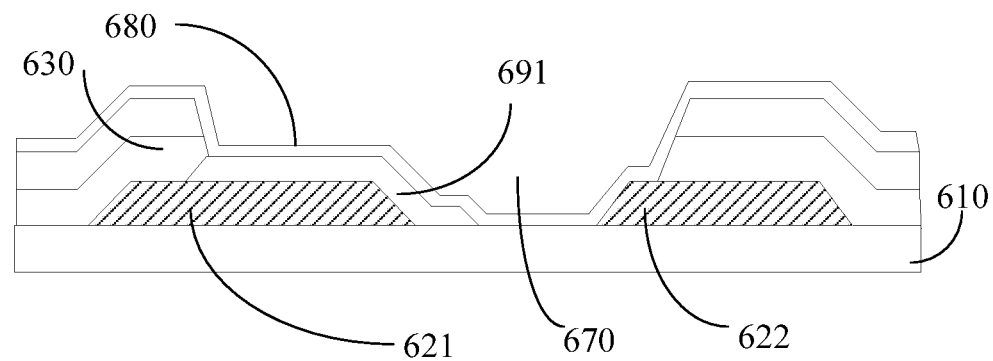
FIG. 7e is a schematic view showing a structure of the substrate formed with an ITO, according to an embodiment of the present disclosure.

Specifically, the above step S27 may be referred to for the step S76 and the step S76 is no longer described in detail herein. FIG. 7e may be referred to for structural configuration of the array substrate assembly obtained after the via hole 670 has been formed and finally an ITO 680 has been deposited. It can be known from FIG. 7e that in the present embodiment, at least a part of the protective pattern 691 remains to isolate the via hole 670 from the gate line 621.

After the gate metal layer is manufactured in manufacturing the array substrate assembly in the manufacturing manner shown in FIG. 7, one material forming process and one material removing process are added. The protective pattern is formed on the gate metal layer by removing a part of the formed protective material.

Optionally, the orthogonal projection of the protective pattern on the substrate may have a circular shape or a polygonal shape. In the embodiments of the present disclosure, both the circular shape and the polygonal shape may serve as shapes of the protective pattern. Structures having the circular shape and the polygonal shape are more easily manufactured than other irregularly-shaped structures, so that technological difficulty can be reduced, thereby increasing production efficiency.

It should be noted that for any one of the embodiments of the present disclosure, each protective pattern may have a thickness which is a half of a thickness of the gate insulating layer. If the protective pattern is excessively thin, the gate line is still probably exposed. If the protective pattern is excessively thick, a thickness of the array substrate assembly will be greatly increased. It is ensured that the protective pattern has a thickness enough to prevent the gate insulating layer from being cut through to expose the gate line in the process of forming the via hole, or to prevent the protective pattern itself from being cut through to expose the gate line (when the protective pattern is disposed in the proximity of the gate line as shown in FIG. 7d).

Embodiments of the present disclosure also provide an array substrate assembly manufactured by the manufacturing method shown in any one of FIG. 1 to FIG. 7.

The embodiments of the present disclosure provide the method of manufacturing the array substrate assembly, and the array substrate assembly, thereby avoiding for example the problem that short circuit between the gate line and the common electrode signal line probably occurs when the via hole for connecting the common electrode signal line and the common electrode is manufactured.

The protective pattern is formed over the gate line, and the orthogonal projection of the protective pattern on the substrate and the orthogonal projection of the via hole on the substrate partly coincide with each other, and the orthogonal projection of the protective pattern on the substrate and the orthogonal projection of the gate line on the substrate partly coincide with each other. Therefore, at least a part of the protective pattern will be etched away when the via hole is formed. In the process of forming the via hole, the gate line is exposed only if the passivation layer, the protective pattern, and the gate insulating layer which are located over the gate line are cut through. However, no protective pattern is disposed over the common electrode signal line. Therefore, in the process of forming the via hole, the common electrode signal line is exposed by cutting through only the passivation layer and the gate insulating layer which are located over the common electrode signal line. Hence, in the process of forming the via hole, it can be ensured that the gate line is not exposed while the common electrode signal line is exposed, thereby avoiding occurrence of short circuit between the gate line and the common electrode signal line.

Although the steps of each method of manufacturing the array substrate assembly according to the embodiments of the present disclosure are described in a certain order, they are not limited to the above order. The steps of each method of manufacturing the array substrate assembly according to the embodiments of the present disclosure may be performed in any appropriate order.

The above embodiments are only used to explain the present disclosure, and should not be construed to limit the present disclosure. It will be appreciated by those skilled in the art that various changes and modifications may be made therein without departing from the spirit and scope of the present disclosure. Therefore, all of equivalent technical solutions also belong to the scope of the present disclosure and the scope of the present disclosure is defined in the appended claims.

What is claimed is:

1. A method of manufacturing an array substrate assembly, the method comprising:
   providing a substrate;
   manufacturing a gate metal layer on the substrate, the gate metal layer comprising a gate line and a common electrode signal line which are spaced from each other;
   forming a gate insulating layer, an active layer, a source-drain electrode layer, a passivation layer, and a protective pattern on the gate metal layer; and forming, in the passivation layer and the gate insulating layer, a via hole configured for a connection to the common electrode signal line, wherein an orthogonal projection of the protective pattern on the substrate and an orthogonal projection of the via hole on the substrate partly coincide with each other, and the orthogonal projection of the protective pattern on the substrate and an orthogonal projection of the gate line on the substrate partly coincide with each other.

2. The method of claim 1, wherein:
the protective pattern is disposed in a same layer as the active layer or as the source-drain electrode layer, or the protective pattern is disposed on the passivation layer or on the gate metal layer.

3. The method of claim 1, wherein:
the protective pattern is disposed in a same layer as the active layer, and forming the gate insulating layer, the active layer, the source-drain electrode layer, the passivation layer, and the protective pattern on the gate metal layer comprises:
forming the gate insulating layer on the gate metal layer;
forming a material for the active layer on the gate insulating layer;
etching the material for the active layer so as to form the active layer and the protective pattern; and
forming the source-drain electrode layer and the passivation layer in sequence on the active layer and the protective pattern.

4. The method of claim 1, wherein:
the protective pattern is disposed in a same layer as the source-drain electrode layer, and forming the gate insulating layer, the active layer, the source-drain electrode layer, the passivation layer, and the protective pattern on the gate metal layer comprises:
forming the gate insulating layer and the active layer on the gate metal layer in sequence;
forming a material for the source-drain electrode layer on the active layer;
etching the material for the source-drain electrode layer so as to form the source-drain electrode layer and the protective pattern; and
forming the passivation layer on the source-drain electrode layer and the protective pattern.

5. The method of claim 1, wherein:
the protective pattern is disposed on the passivation layer, and forming the gate insulating layer, the active layer, the source-drain electrode layer, the passivation layer, and the protective pattern on the gate metal layer comprises:
forming the gate insulating layer, the active layer, the source-drain electrode layer, and the passivation layer on the gate metal layer in sequence; and
etching the passivation layer so as to form the protective pattern on the passivation layer.

6. The method of claim 1, wherein:
the protective pattern is disposed on the passivation layer, and forming the gate insulating layer, the active layer, the source-drain electrode layer, the passivation layer, and the protective pattern on the gate metal layer comprises:
forming the gate insulating layer, the active layer, the source-drain electrode layer, and the passivation layer on the gate metal layer in sequence;
forming a layer of protective material on the passivation layer; and removing a part of the protective material so as to form the protective pattern.

7. The method of claim 6, wherein:
the protective material is one of metal, amorphous silicon, silicon nitride, resin and photoresist.

8. The method of claim 1, wherein:
the protective pattern is disposed on the gate metal layer, and forming the gate insulating layer, the active layer, the source-drain electrode layer, the passivation layer, and the protective pattern on the gate metal layer comprises:
forming the gate insulating layer on the gate metal layer;
etching the gate insulating layer so as to form the protective pattern on the gate insulating layer; and
forming the active layer, the source-drain electrode layer and the passivation layer in sequence on the gate insulating layer with the protective pattern.

9. The method of claim 1, wherein:
the protective pattern is disposed on the gate metal layer, and forming the gate insulating layer, the active layer, the source-drain electrode layer, the passivation layer, and the protective pattern on the gate metal layer comprises:
forming a layer of protective material on the gate metal layer;
removing a part of the protective material so as to form the protective pattern; and
forming the gate insulating layer, the active layer, the source-drain electrode layer, and the passivation layer in sequence on the protective pattern and the gate metal layer.

10. The method of claim 9, wherein:
the protective material is one of silicon nitride, resin and photoresist.

11. The method of claim 1, wherein:
the orthogonal projection of the protective pattern on the substrate has a circular shape or a polygonal shape.

12. The method of claim 1, wherein:
the protective pattern has a thickness which is a half of a thickness of the gate insulating layer.

13. The method of claim 1, wherein:
the orthogonal projection of the protective pattern on the substrate and the orthogonal projection of the via hole on the substrate partly coincide with each other on one side of the orthogonal projection of the protective pattern which faces away from the gate line in a direction perpendicular to the gate line, and the orthogonal projection of the protective pattern on the substrate and the orthogonal projection of the gate line on the substrate partly coincide with each other on the other side of the orthogonal projection of the protective pattern which faces towards the gate line in the direction perpendicular to the gate line.

14. The method of claim 1, wherein:
a center of the orthogonal projection of the protective pattern on the substrate and a center of the orthogonal projection of the via hole on the substrate are aligned with each other in a direction perpendicular to the gate line.

15. The method of claim 1, wherein:
a maximal size, in a longitudinal direction of the gate line, of the orthogonal projection of the protective pattern on the substrate is greater than a maximal size, in the longitudinal direction of the gate line, of the orthogonal projection of the via hole on the substrate.

16. An array substrate assembly, wherein:
the array substrate assembly is manufactured by the method of claim 1.

* * * * *